(12) United States Patent
Ding et al.

(10) Patent No.: US 6,171,909 B1
(45) Date of Patent: Jan. 9, 2001

(54) METHOD FOR FORMING A STACKED GATE

(75) Inventors: Yen-Lin Ding; Gary Hong, both of Hsinchu (TW)

(73) Assignee: United Semiconductor Corp., Hsinchu (TW)

( * ) Notice: Under 35 U.S.C. 154(b), the term of this patent shall be extended for 0 days.

(21) Appl. No.: 09/293,434

(22) Filed: Apr. 16, 1999

(30) Foreign Application Priority Data

Mar. 1, 1999 (TW) .................................................. 88103048

(51) Int. Cl.$^7$ .................................................. H01L 21/336
(52) U.S. Cl. .......................... 438/267; 438/593; 438/596; 438/296
(58) Field of Search ..................................... 438/267, 593, 438/596, FOR 189, FOR 199, FOR 203, 296

(56) References Cited

U.S. PATENT DOCUMENTS 5,652,161 * 7/1997 Ahn .
5,756,384 * 5/1998 Tseng .
5,950,090 * 9/1999 Chen et al. .
5,981,365 * 11/1999 Cheek et al. .

* cited by examiner

Primary Examiner—George Fourson
Assistant Examiner—Michelle Estrada
(74) Attorney, Agent, or Firm—J.C. Patents; Jiawei Huang

(57) ABSTRACT

A method for forming a stacked gate of a flash memory cell is described. A first dielectric layer, a conductive layer and a silicon nitride layer are sequentially formed over a substrate. A photoresist pattern is formed over the silicon nitride layer. The silicon nitride layer, conductive layer, first dielectric layer and substrate are etched by using the photoresist pattern as an etching mask until forming a plurality of trenches in the substrate. An insulating layer is formed over the substrate, wherein the insulating layer has a surface level between a top surface of the conductive layer and a bottom surface of the conductive layer. A conductive spacer is formed on the sidewalls of the conductive layer and silicon nitride layer, wherein the conductive spacer and conductive layer serve as a first gate conductive layer. The silicon nitride layer is removed. A second dielectric layer and a second gate conductive layer are formed over the substrate. The second gate conductive layer, second dielectric layer and first gate conductive layer are patterned to form a control gate, a patterned dielectric layer and a floating gate, respectively.

9 Claims, 5 Drawing Sheets

METHOD FOR FORMING A STACKED GATE

CROSS-REFERENCE TO RELATED APPLICATION

This application claims the priority benefit of Taiwan application serial no. 88103048, filed Mar. 1, 1999, the full disclosure of which is incorporated herein by reference.

BACKGROUND OF THE INVENTION

1. Field of the Invention

This invention relates to a method for fabricating a flash memory cell, and more particularly, to a method for forming a stacked gate.

2. Description of Related Art

Recently, high-density flash memories have been receiving much attention for application in many fields. One of the most important factors is the low cost of the reduced size of each flash memory cell. However, it is very hard to shrink the cell size in the fabrication of conventional flash memory cells, because a local oxidation (LOCOS) isolation technique is used. The isolation structure formed by the technique limits a reduction of the flash memory.

Another isolation technique called shallow trench isolation (STI) has been disclosed. The fabrication of a flash memory cell comprises the implementation of the STI technique to reduce the cell size. The small-sized cell benefits the integration of the flash memory cell on a wafer. However, the coupling ratio of the cell decreases as the size of the cell becomes small. The decrease is because the overlapping area between the floating gate and the control gate in the cell is reduced.

When the coupling ratio is low, a higher voltage must be supplied in order to operate the memory programming and erasing actions. A high operating voltage makes any dimensional reduction of the flash memory cell very difficult. On the other hand, for a flash memory cell having a high coupling ratio, the electric field necessary to initiate an F-N tunneling is high, thereby slowing the tunneling speed of electrons from the floating gate to the source/drain region. The effect slows down the speed of a read or a write operation in the flash memory.

SUMMARY OF THE INVENTION

In one aspect, the present invention provides a method for increasing the coupling ratio of a memory cell.

In another aspect, the present invention provides a method for reducing the size of a memory cell.

In a further aspect, the present invention provides a method for forming a stacked gate of a flash memory cell. A first dielectric layer, a conductive layer and a silicon nitride layer are sequentially formed over a substrate. A photoresist pattern is formed over the silicon nitride layer. The silicon nitride layer, conductive layer, first dielectric layer and substrate are etched with the photoresist pattern serving as an etching mask until a plurality of trenches is formed in the substrate. An insulating layer is formed over the substrate, wherein the insulating layer has a surface level between a top surface of the conductive layer and a bottom surface of the conductive layer. A conductive spacer is formed on the sidewalls of the conductive layer and silicon nitride layer, wherein the conductive spacer and conductive layer serve as a first gate conductive layer. The silicon nitride layer is removed. A second dielectric layer and a second gate conductive layer are formed over the substrate. The second gate conductive layer, second dielectric layer and first gate conductive layer are patterned to form a control gate, a patterned dielectric layer and a floating gate, respectively.

The coupling ratio of the stacked gate comprising the floating gate and control gate is increased by forming the conductive spacer. The size of a memory cell comprising the stacked gate is reduced by patterning the conductive layer and forming the trenches at the same time.

It is to be understood that both the foregoing general description and the following detailed description are exemplary and explanatory only and are not restrictive of the invention, as claimed.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

A feature of the present invention is the formation of a floating gate comprising a conductive layer and a conductive spacer. The related details are as follows.

Figure 1A:
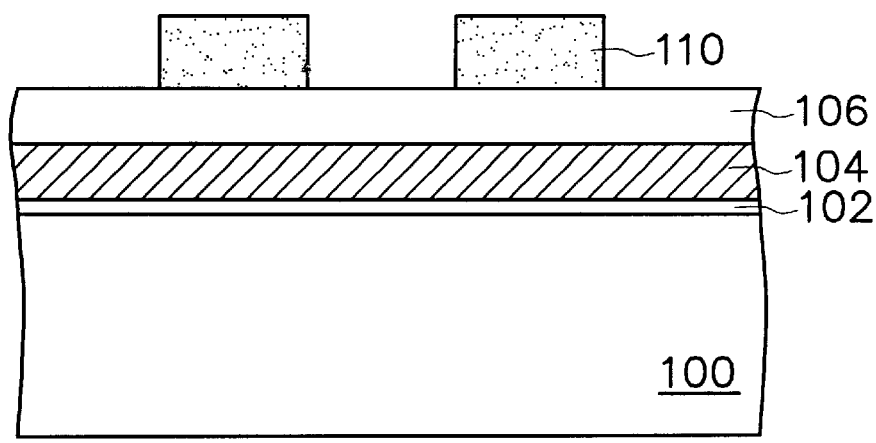
FIGS. 1A–1J are cross-sectional views showing the progression of manufacturing steps in the fabrication of a stacked gate of a NAND-type flash memory according to one preferred embodiment of this invention.
Figure 2:
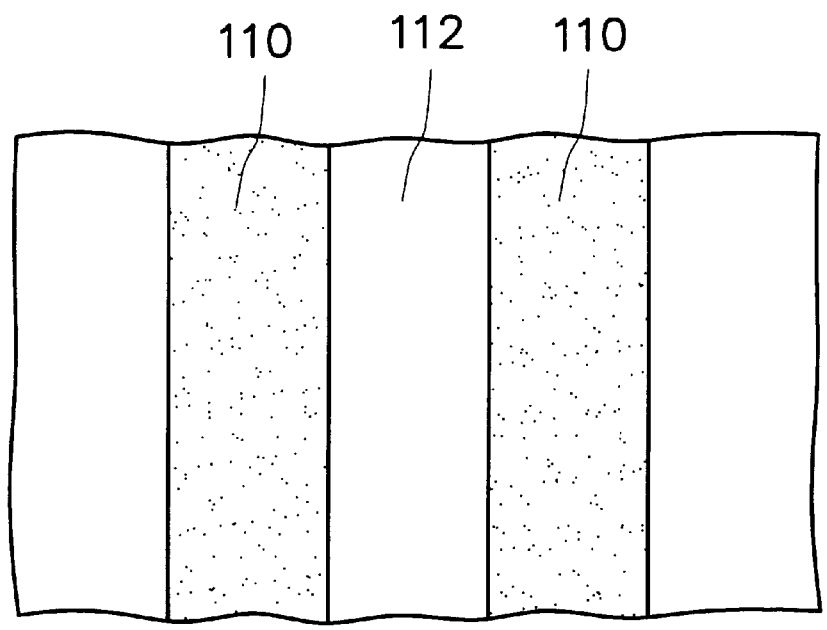
FIG. 2 is a top view of FIG. 1A.

Referring to FIG. 1A, a well and a source/drain region (not shown) are formed in a substrate. The technique is well known to persons skilled in the art. A first dielectric layer 102, a conductive layer 104 and a silicon nitride layer 106 are sequentially formed over the substrate 100. A photoresist pattern 110 is formed over the silicon nitride layer 106. In a top view of FIG. 1A, the photoresist pattern 110 comprises a plurality of strips, as shown in FIG. 2.

The first dielectric layer 102 is formed by, for example, oxidizing the substrate to form a tunneling oxide layer with a thickness of about 60 to 120 angstroms. The conductive layer 104 is typically made of doped polysilicon. The silicon nitride layer 106 is typically formed by a deposition method.

Figure 1B:
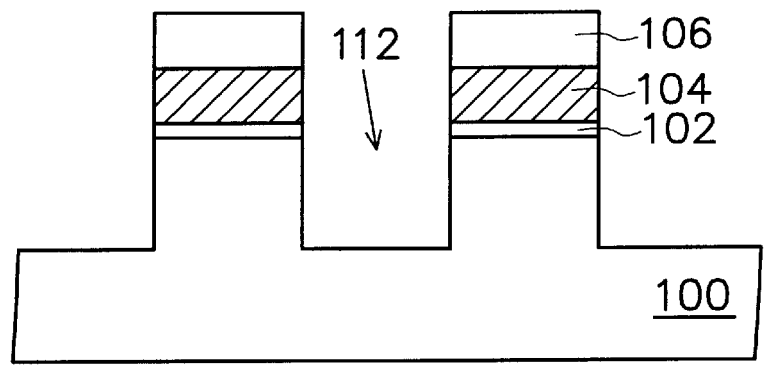

Referring to FIG. 1B, the silicon nitride layer 106, the conductive layer 104, the first dielectric layer 102 and the substrate 100 are anisotropically etched by using the photoresist pattern 110 as an etching mask until a plurality of trenches 112 are formed in the substrate 100. The photoresist pattern 110 is removed after the anisotropic etching step.

Figure 1C:
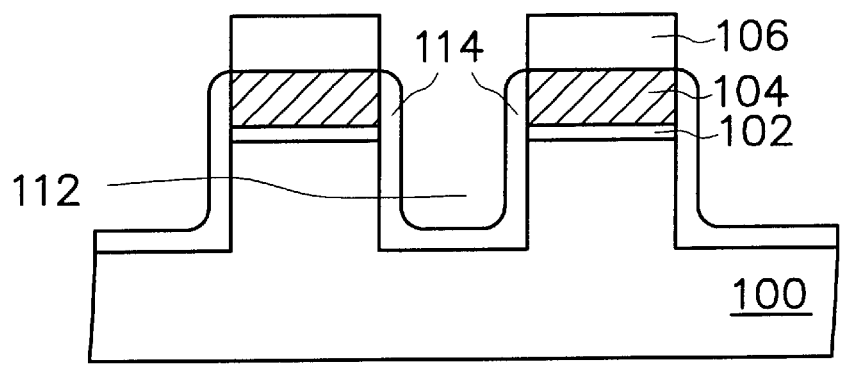

Referring to FIG. 1C, a liner oxide layer 114 is formed on surfaces of the trenches 112, sidewalls of the first dielectric layer 102 and the conductive layer 104. The liner oxide layer 114 can be formed by a thermal oxidation method. In the thermal oxidation, the surfaces of the trenches 112 and the conductive layer 104 are oxidized to form thin oxide layers which extend to one another so as to cover the sidewall of the first dielectric layer 102, whereas the sidewall of the nitride silicon has no liner oxide layer formed on it.

Figure 1D:
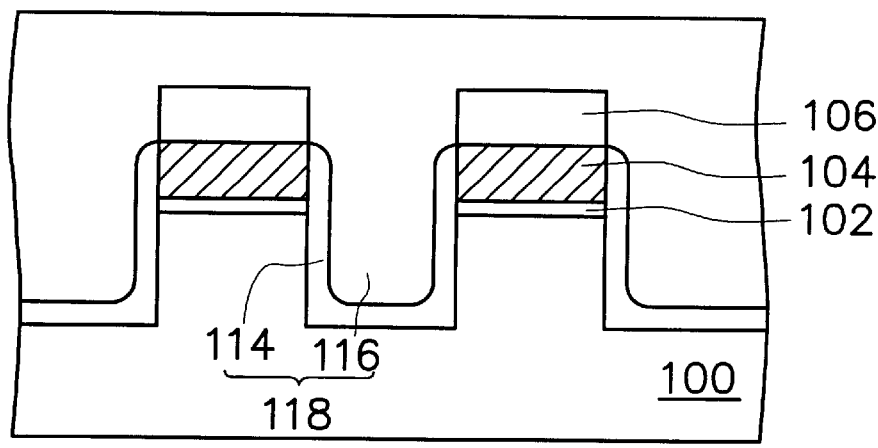

Referring to FIG. 1D, an oxide layer 116 is formed over the substrate 100. The thickness of the oxide layer 116 is sufficient to cover the silicon nitride layer 106.

Figure 1E:
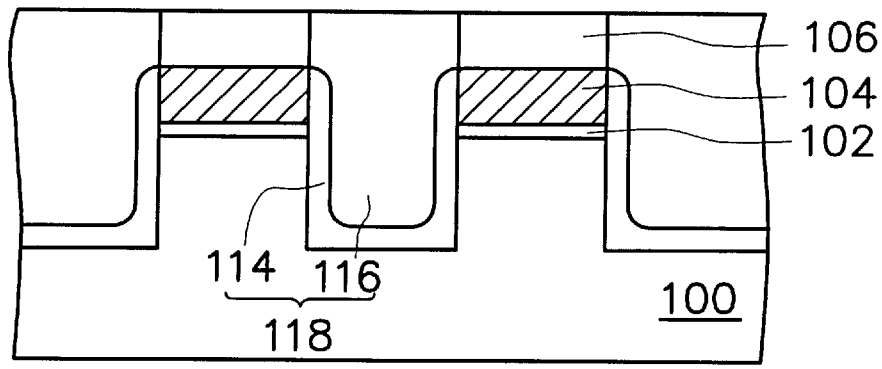

Referring to FIG. 1E, a chemical-mechanical polishing process is performed to planarize the oxide layer 116 by using the silicon nitride layer 106 as a polishing stop layer. The liner oxide layer 114 and oxide layer 116 together serve as an insulating layer 118.

Figure 1F:
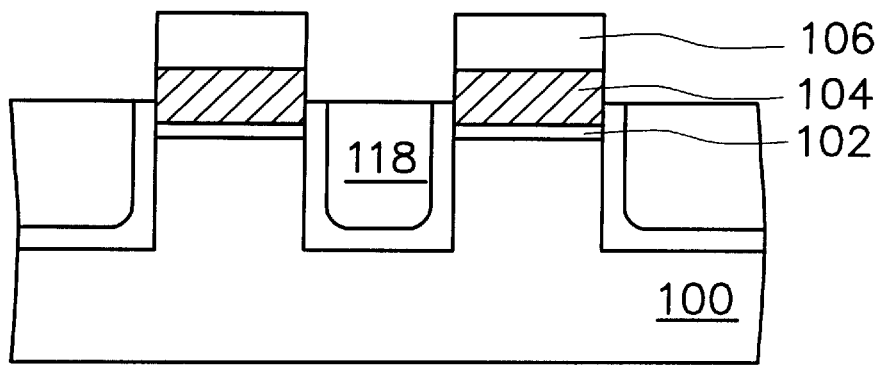

Referring to FIG. 1F, the insulating layer 118 is etched back to expose an upper portion of the conductive layer 104. Being etched, the insulating layer 118 has a surface level between a top surface of the conductive layer 104 and a bottom surface of the conductive layer 104. The etching step is typically performed by dry etching or wet etching. The insulating layer 118 typically made of silicon oxide serves as a shallow trench isolation (STI) structure.

Figure 1G:
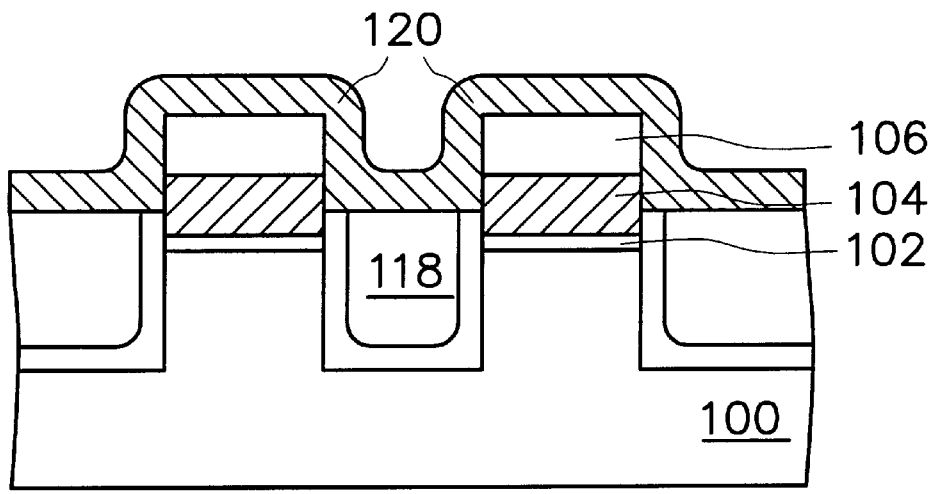

Referring to FIG. 1G, a conductive material layer 120 is formed over the substrate 100. The conductive material layer 120 is typically made of doped polysilicon.

Figure 1H:
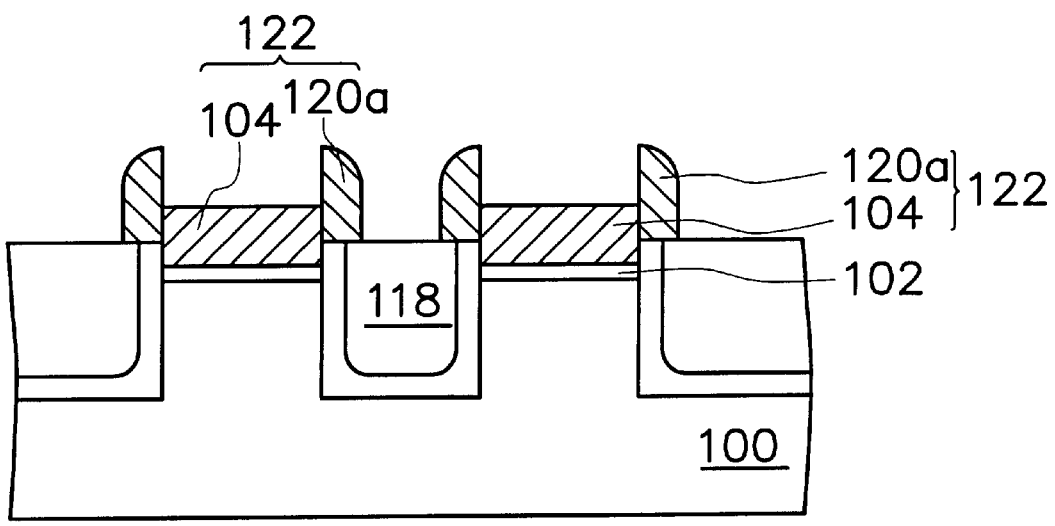

Referring to FIG. 1H, the conductive material layer (120 shown in FIG. 1G) is anisotropically etched until the nitride silicon layer 106 and the insulating layer 118 are exposed. A conductive spacer 120a is formed on the sidewalls of the conductive layer 104 and the silicon nitride layer (106 shown in FIG. 1G) after performing the etching step. The conductive spacer 120a and conductive layer 104 together serve as a first gate conductive layer 122. The silicon nitride layer 106 is removed after forming the first gate conductive layer 122.

Figure 1I:
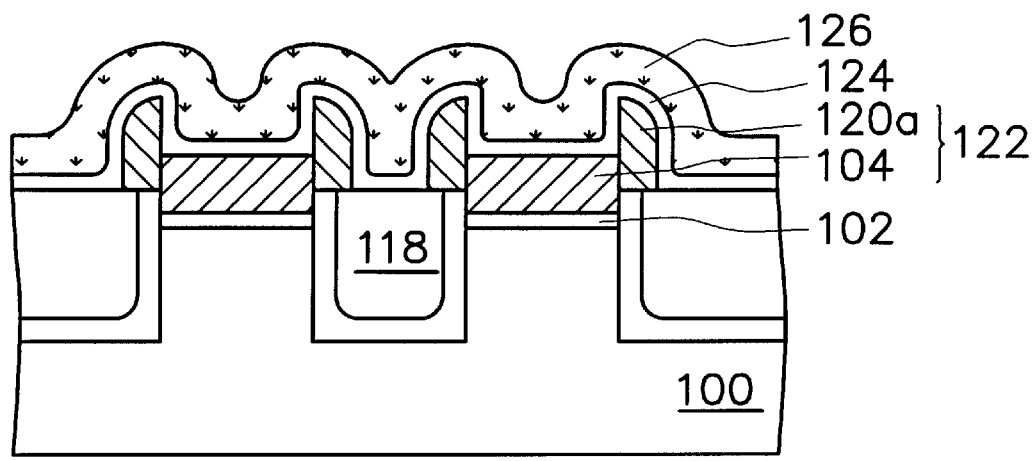

Referring to FIG. 1I, a second dielectric layer 124 and a second gate conductive layer 126 are sequentially formed over the substrate 100. The second dielectric layer 124 is typically an oxide/nitride/oxide (ONO) layer, which comprises a bottom oxide layer, an interoxide nitride layer and a top oxide layer. The second gate conductive layer 126 is typically made of doped polysilicon.

Figure 1J:
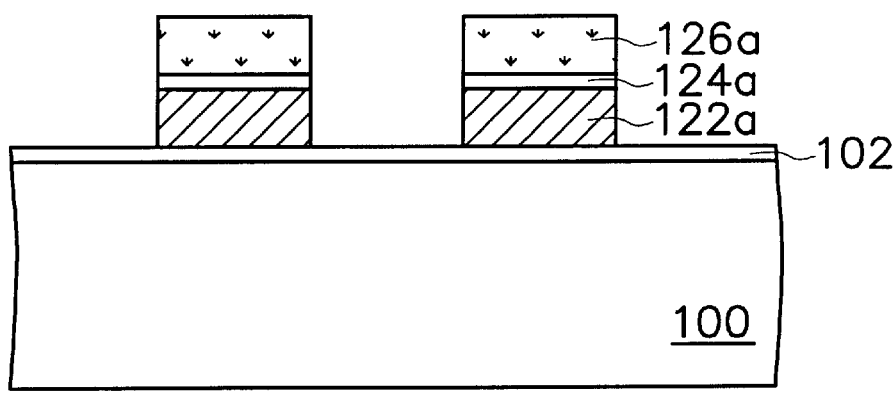
Figure 3:
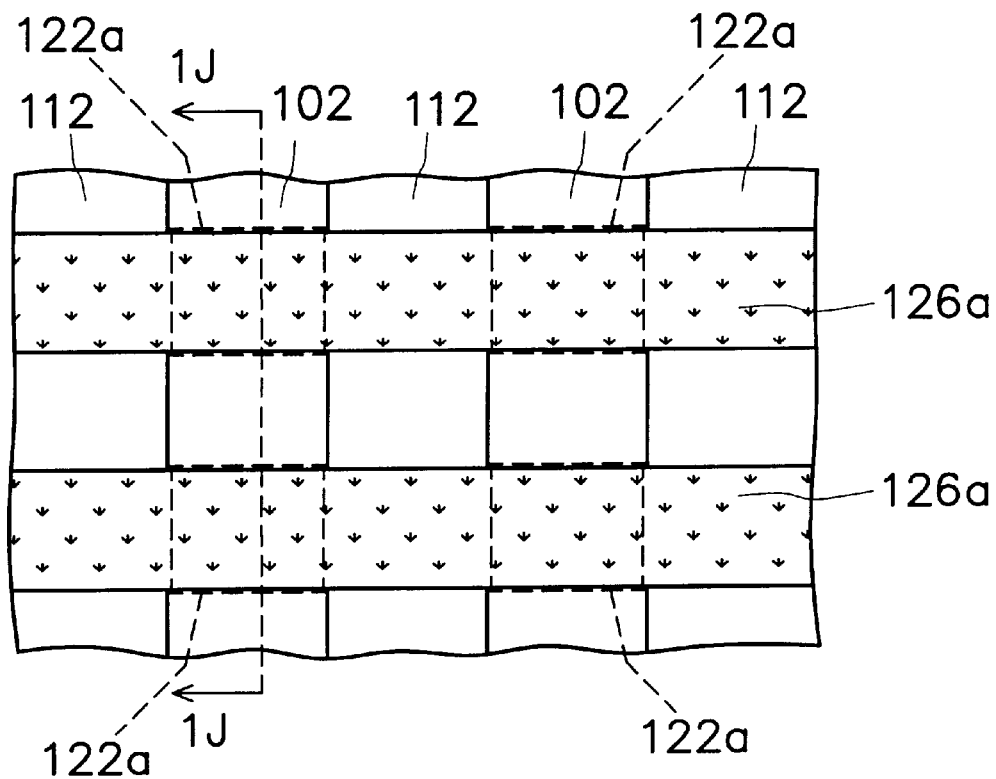
FIG. 3 is a top view of FIG. 1J.

As shown in FIG. 3, which is a top view of the substrate 100, the second gate conductive layer (126 shown in FIG. 1I), second dielectric layer (124 shown in FIG. 1I) and first gate conductive layer (122 shown in FIG. 1I) are patterned to form a control gate 126a, patterned dielectric film 124a and floating gate 122a, respectively. The direction extension of the control gate is perpendicular with that of the STI structure. The control gate 126a comprises a plurality of gate conductive strips. The floating gate 122a comprises a plurality of gate conductive blocks. The control gate 126a, the patterned dielectric film 124a and the floating gate 122a are also shown in FIG. 1J, which is a schematic, cross-sectional view with respect to line IJ—IJ in FIG. 3. The stacked gate comprising the control gate 126a and floating gate 122a is completed after performing the patterning step.

Subsequent steps performed after the patterning step are well known to persons skilled in the art. For example, they can be some steps of a standard NAND cell process. The memory cells are completed after performing those steps.

The previously described versions of the present invention have many advantages, comprising:

1. The coupling ratio of the stacked gate is increased by forming the conductive spacer. The conductive spacer, which is a portion of the floating gate, increases the capacitor area between the floating gate and control gate.
2. The size of each memory cell is reduced by patterning the conductive layer and forming the trenches at the same time. The STI structure formed after forming the trenches serves as a self-aligned STI structure. In other words, the self-aligned STI structure pushes the isolation pitch consisting of the STI structure and active region to a minimized rule, wherein the active region has the stacked gate formed thereon.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a stacked gate, the method comprising:

sequentially forming a first dielectric layer, a conductive layer and a silicon nitride layer over a substrate;

patterning the silicon nitride layer, the conductive layer, the first dielectric layer and the substrate until forming a plurality of trenches in the substrate;

forming an insulating layer over the substrate, wherein the insulating layer has a surface level between a top surface of the conductive layer and a bottom surface of the conductive layer;

forming a conductive spacer on sidewalls of the conductive layer and silicon nitride layer, wherein the conductive spacer and the conductive layer together serve as a first gate conductive layer;

removing the silicon nitride layer;

sequentially forming a second dielectric layer and a second gate conductive layer over the substrate; and patterning the second gate conductive layer, the second dielectric layer and the first gate conductive layer to form a control gate, a patterned dielectric layer and a floating gate, respectively.

2. The method of claim 1, wherein the step of forming the insulating layer comprises:

forming a liner oxide layer on an inner wall of the trenches, a sidewall of the first dielectric layer and the sidewall of the conductive layer;

forming an oxide layer over the substrate, wherein a thickness of the oxide layer is sufficient to cover the silicon nitride layer;

performing a chemical-mechanical polishing process to planarize the oxide layer by using the silicon nitride layer as a polishing stop layer; and etching back the oxide and liner oxide layers to expose an upper portion of the conductive layer.

3. The method of claim 1, wherein the step of forming the conductive spacer comprises:

forming a conductive material layer over the substrate; and anisotropically etching the conductive material layer.

4. The method of claim 1, wherein the floating gate is made of a first doped polysilicon.

5. The method of claim 1, wherein the second dielectric layer comprises an oxide/nitride/oxide (ONO) layer.

6. The method of claim 1, wherein the control gate is made of a second doped polysilicon.

7. A method for forming a floating gate, the method comprising:

providing a purality of conductive strips of which every two neighboring conductive strips are isolated by a shallow trench isolation (STI) structure, wherein the STI structure has a surface level between a top surface and a bottom surface of each of the conductive strips;

forming a plurality of conductive spacers on sidewalls of the conductive strips;

sequentially forming a dielectric layer and a conductive layer over the substrate; and patterning the conductive layer, the dielectric layer, the conductive strips and the conductive spacers, wherein the patterned conductive strips and the patterned conductive spacers together serve as the floating gate.

8. The method of claim 7, wherein the conductive strips are made of doped polysilicon.

9. The method of claim 7, wherein the conductive spacers are made of doped polysilicon.

* * * * *